(12) United States Patent
Huang et al.

(10) Patent No.: US 11,646,742 B1
(45) Date of Patent: May 9, 2023

(54) INCREASED PHASE INTERPOLATOR LINEARITY IN PHASE-LOCKED LOOP

(71) Applicant: NVIDIA Corporation, Santa Clara, CA (US)

(72) Inventors: Yi-Chieh Huang, Zhubei (TW); Ying Wei, San Jose, CA (US); Bo-Yu Chen, Taichung (TW)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/526,753

(22) Filed: Nov. 15, 2021

(51) Int. Cl.
  *H03L 7/087* (2006.01)
  *H03L 7/099* (2006.01)
  *H03K 19/173* (2006.01)
  *H03L 7/083* (2006.01)
  *H03L 7/081* (2006.01)

(52) U.S. Cl.
  CPC ....... *H03L 7/0998* (2013.01); *H03K 19/1737* (2013.01); *H03L 7/083* (2013.01); *H03L 7/0816* (2013.01)

(58) Field of Classification Search
  CPC ... H03L 7/087; H03L 7/06; H03L 7/08; H03L 7/1077; H04L 7/033; H04L 7/0331

USPC .................. 375/375, 376; 327/147, 162, 163
  See application file for complete search history.

(56) References Cited

U.S. PATENT DOCUMENTS

| | | | |
|---|---|---|---|
| 6,191,649 B1 * | 2/2001 | Sugita | H04L 27/2273 329/304 |
| 6,211,741 B1 * | 4/2001 | Dalmia | H03D 13/004 331/11 |

\* cited by examiner

*Primary Examiner* — Hai L Nguyen
(74) *Attorney, Agent, or Firm* — Lowenstein Sandler LLP

(57) ABSTRACT

A phase-locked loop (PLL) device includes a first phase detector to receive an in-phase reference clock and an in-phase feedback clock, the first phase detector to output a first phase error; a second phase detector to receive a quadrature reference clock and a quadrature feedback clock, the second phase detector to output a second phase error; a proportional path component to generate first current pulses from the first phase error and second current pulses from the second phase error; an integrator circuit coupled to the proportional path component, the integrator circuit to sum, within a current output signal, the first current pulses and the second current pulses; a ring oscillator to be driven by the current output signal; and a pair of phase interpolators coupled to an output of the ring oscillator, the pair of phase interpolators to respectively generate the in-phase feedback clock and the quadrature feedback clock.

18 Claims, 7 Drawing Sheets

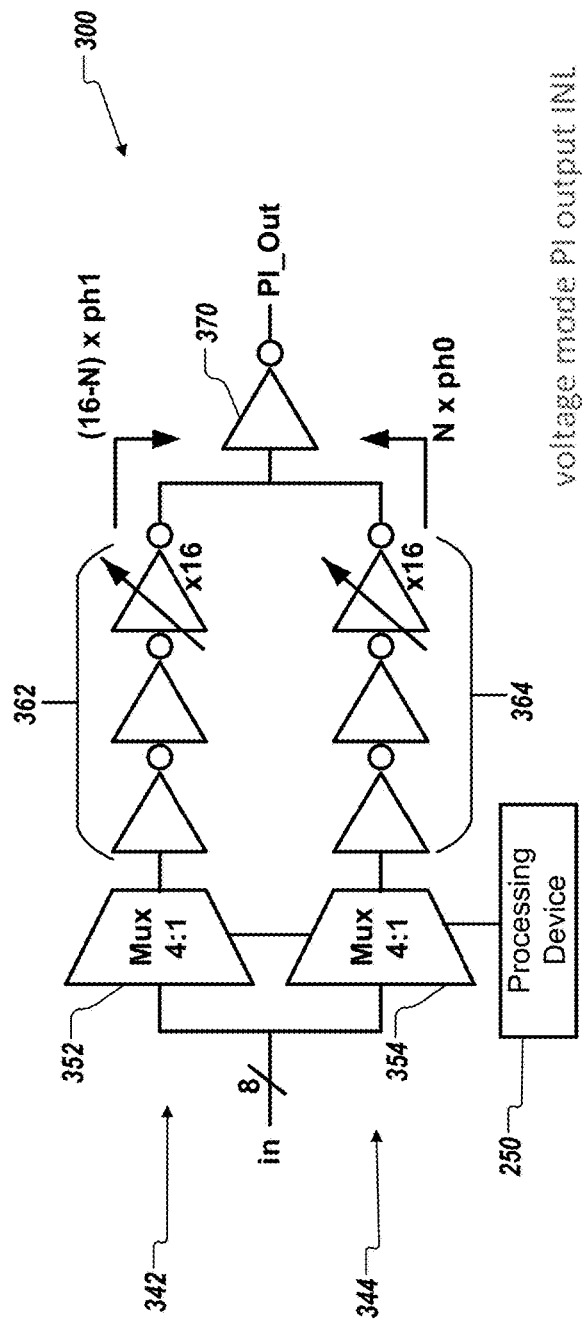
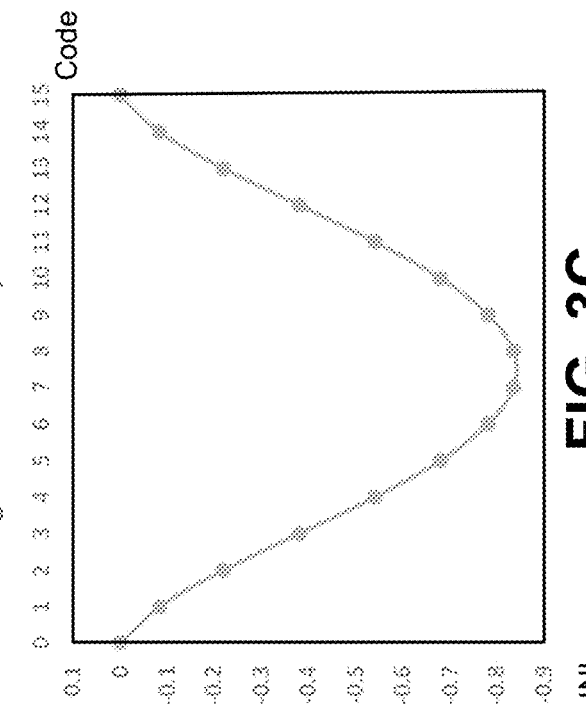
FIG. 3A
FIG. 3C
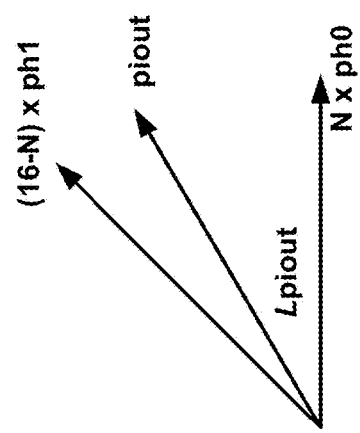
FIG. 3B

INCREASED PHASE INTERPOLATOR LINEARITY IN PHASE-LOCKED LOOP

TECHNICAL FIELD

At least one embodiment pertains to processing resources used to perform and facilitate network communication. For example, at least one embodiment pertains to technology for increasing linearity in a phase interpolator of a phase-locked loop.

BACKGROUND

Network devices that employ serializer/deserializer (SerDes) technology operate off a multiphase clock generated for the timing of multiple data lanes. The data lanes are arranged between a data amplifier and multiple sampler circuits, which, for example, feed data to a deserializer within a receiver (RX) of a high-speed link device. A phase-locked loop (PLL) can be employed between feed-forward clock circuitry and the multiple sampler circuits to adjust for timing of a feed-forward clock used to time sampling by the multiple sampler circuits. The PLL will often employ a phase interpolator (PI) that interpolates input phase to output phase.

BRIEF DESCRIPTION OF DRAWINGS

Various embodiments in accordance with the present disclosure will be described with reference to the drawings, in which:

FIG. 3A is a simplified circuit diagram of a pair of phase interpolators (PIs) of the PLL in accordance with at least some embodiments;

FIG. 3B is a PI code diagram illustrating that an output of the pair of PIs has a phase that is a combination of the phase of each PI of the pair of PIs in accordance with at least some embodiments;

FIG. 3C is a graph illustrating the PI codes associated with a voltage mode PI versus output integral nonlinearity (INL), in accordance with some embodiments;

DETAILED DESCRIPTION

Figure 1A:
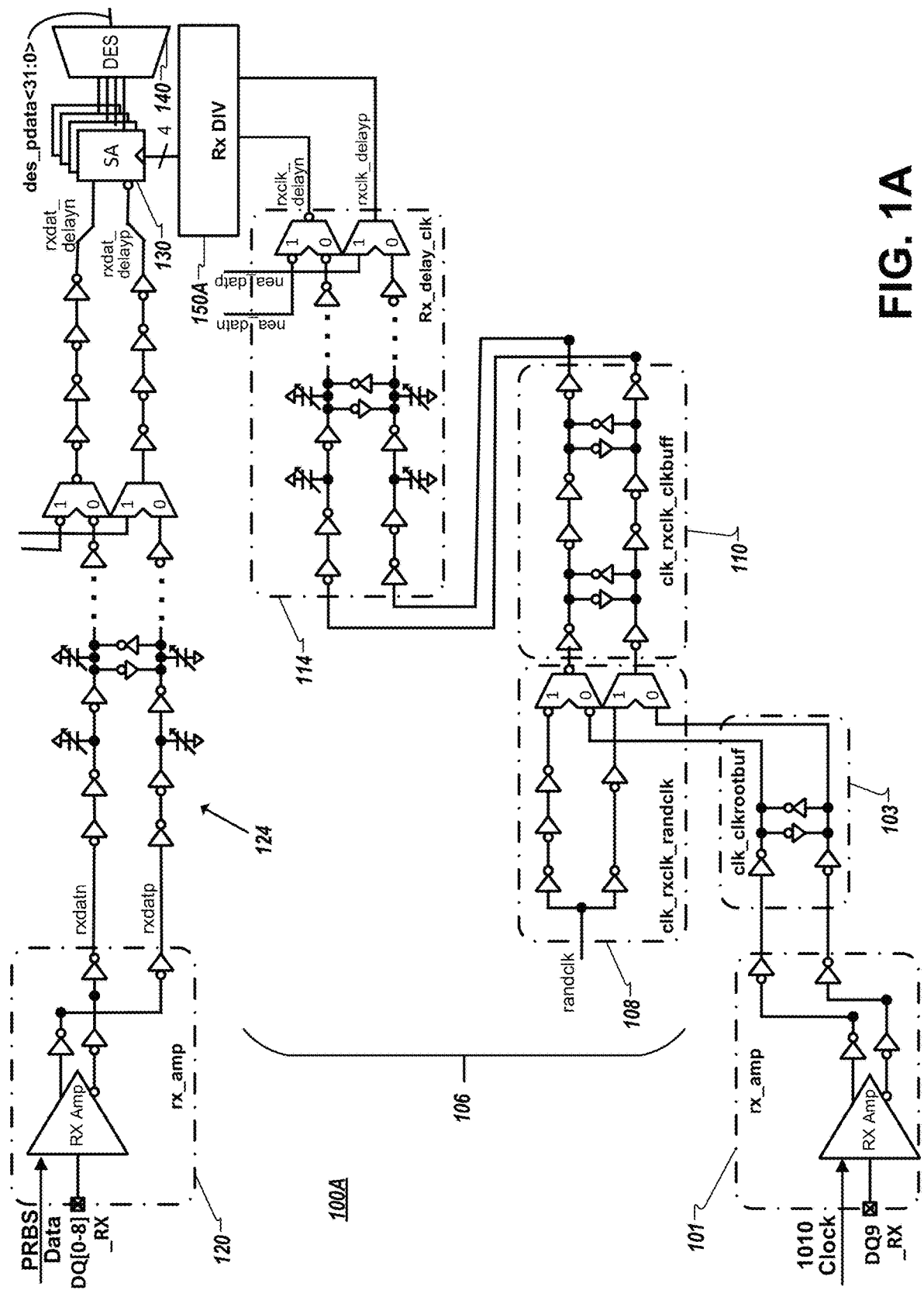
FIG. 1A is a circuit diagram of a data deserializer system in a receiving (RX) link device that employs delay line structures to match delay between a clock lane and multiple data lanes in accordance with at least some embodiments.

In some SerDes devices of systems, it can be challenging to adjust for phase skew and phase offsets between a clock lane and data lanes in a receiver architecture of a receiving (RX) link device or other similar high-speed SerDes link device. Due to the high-speeds, the clock lane may need to be extended to many multiples of delay stages (to match delays to a set of data lanes), creating phase skew, phase offsets, and additional delays that vary compared to those of the corresponding set of data lanes. For example, for multiple channels defined by the set of data lanes, phase skew is dispersed differently across the data lanes (e.g., greater than 10 picoseconds (ps) different), making it more difficult to also account for phase offsets between the data lanes and the clock lane. Therefore, the receiver architecture is challenged with aligning phase timing between the data lanes and the clock lane. Further, there is generally no closed-loop clock and data recovery (CDR) circuitry, making it difficult to adjust for these types of deviations and other circuit variations.

Aspects of the present disclosure can address these phase-timing challenges and other challenges, at least in part, by employing a phase-locked loop (PLL) device or PLL circuit (e.g., RX PLL) positioned between feed-forward clock circuitry (e.g., of a feed-forward clock path) and a set of sampler circuits that sample data from a set of data lanes of the RX link device. The feed-forward clock circuitry can generate an amplified, delayed clock (e.g., RX clock) while the RX PLL can be configured to interpolate an input phase of the RX clock to a multiphase output signal having phases relating (e.g., synchronized) to the input phase. Thus, the RX PLL can be configured to adjust for phase offsets between the clock lane and the data lanes, where the output phases of the output signal are synchronized to the RX clock as reference inputs to the RX PLL. Current PLLs, however, experience systematic non-linearity in this interpolation of the input phase to the output signal. Too much non-linearity is unacceptable for some SerDes devices due to the high speeds and low tolerance for phase skew.

In various embodiments, the linearity of the PLL interpolation is increased by positioning a pair of phase interpolators (PIs) in a feedback path of the RX PLL between a ring oscillator and phase detectors that respectively receive, from the RX clock, an in-phase reference clock, and a quadrature reference clock. In these embodiments, the phase of one of the PIs (e.g., an in-phase PI) is shifted compared to the other PI (e.g., a quadrature PI) so that INL across the pair of PIs are significantly canceled once the in-phase feedback clock from the in-phase PI is combined with the quadrature feedback clock from the quadrature PI within an integrator circuit of the PLL. Shifting the phases can be implemented using control logic that determines and sends certain PI codes to both the in-phase PI and the quadrature PI. For example, the shifted PI code sent to the quadrature PI can be shifted by a set value that causes an INL low point of the in-phase PI to become an INL high point in the quadrature PI (or vice versa), thus maximizing the INL cancelation in the integrator circuit. This maximization of INL cancelation improves the linearity of the phase interpolation of the PLL device or PLL circuit, as further explained hereinafter.

Therefore, advantages of the devices, systems, and methods implemented in accordance with some embodiments of the present disclosure include, but are not limited to, increased linearity of phase interpolation within PLLs such as an RX PLL that is employed within SerDes devices and systems. Increased linearity improves adjusting for phase offsets between multiphase data lanes and the clock lane, thus enabling better accounting for phase skew in high-speed communication systems. Other advantages will be apparent to those skilled in the art of high-speed communication links also referred to as SerDes devices, which will be discussed hereinafter.

FIG. 1A is a circuit diagram of a data deserializer system 100A in a receiving (RX) link device that employs delay line structures to match delay between a clock lane and multiple data lanes, in accordance with at least some embodiments. While the system 100A relates to an RX link device that is understood to be a SerDes link device, the disclosed embodiments of the system 100A can also be applied to other multi-channel deserializer systems or another communication device that operates at high speed.

In at least some embodiments, the system 100A includes at least an RX clock amplifier 101, a clock root buffer 103 coupled to the RX clock amplifier 101, feed-forward clock circuitry 106 coupled to the clock root buffer 103, an RX data amplifier 120, a set of RX data lanes 124 coupled to the RX data amplifier 120, a set of sampler circuits 130 coupled to the set of RX data lanes 124, and a deserializer 140 coupled to an output of the set of RX sampler circuits 130. In these embodiments, the feed-forward clock circuitry 106 can include a random clock selector 108 with the option to select a random clock rather than the clock generated by the RX amplifier 101, an RX clock buffer 110, an RX clock delay line 114 and an RX divider (DIV) 150A coupled to the set of sampler circuits 130. The feed-forward clock circuitry 106 can also include additional circuitry and other stages not illustrated in FIG. 1A that has been simplified for purposes of explanation.

In at least some embodiments, the RX clock amplifier 101 amplifies an RX clock to generate an amplifier RX clock, which is buffered in the clock root buffer 103. The RX clock is also provided to a clock lane (e.g., SerDes clock lane) of the communication link device, which are not illustrated for simplification purposes. The RX clock can be understood to include a positive clock and a negative clock, thus the reason for the differential structure of the feed-forward clock circuitry 106, e.g., which provides a feed-forward clock path within the set of RX data lanes 124. The RX data amplifier 120 amplifies an RX data to generate an amplified RX data within the set of data lanes 124. In these embodiments, the set of sampler circuits 130 are configured to sample data from respective data lanes of the set of RX data lanes 124 according to a multiphase RX clock provided by the RX DIV 150A. Each data lane of the set of RX data lanes 124 includes a positive data path and a negative data path thus the reason for the differential structure.

In various embodiments, the feed-forward clock circuitry 106 includes a first set of inverters with a first delay. The set of RX data lanes 124 further includes a second set of inverters with a second delay. In some embodiments, these inverters are instead differential stages that create delay. One function of the RX clock delay line 114 of the feed-forward clock circuitry 106 is to match the first delay to the second delay, but this can be difficult due to temperature and supply voltage deviations, among other variations. Further, the length of the feed-forward clock circuitry 106 increases jitter such as power supply induced jitter (PSIJ), deterministic jitter (DJ), and random jitter (RJ) that is also exhibited in the clock lanes. Further, as described herein, these longer clock lanes can create phase offsets between the feed-forward clock circuitry 106 and the set of RX data lanes 124. These challenges in the delay structure design of the system 100A can be resolved by replacing latter portions of the feed-forward clock circuitry 106 (e.g., the RX DIV 150A) with the disclosed RX PLL discussed hereinafter, which also increases linearity in a phase interpolator of the RX PLL.

Figure 1B:
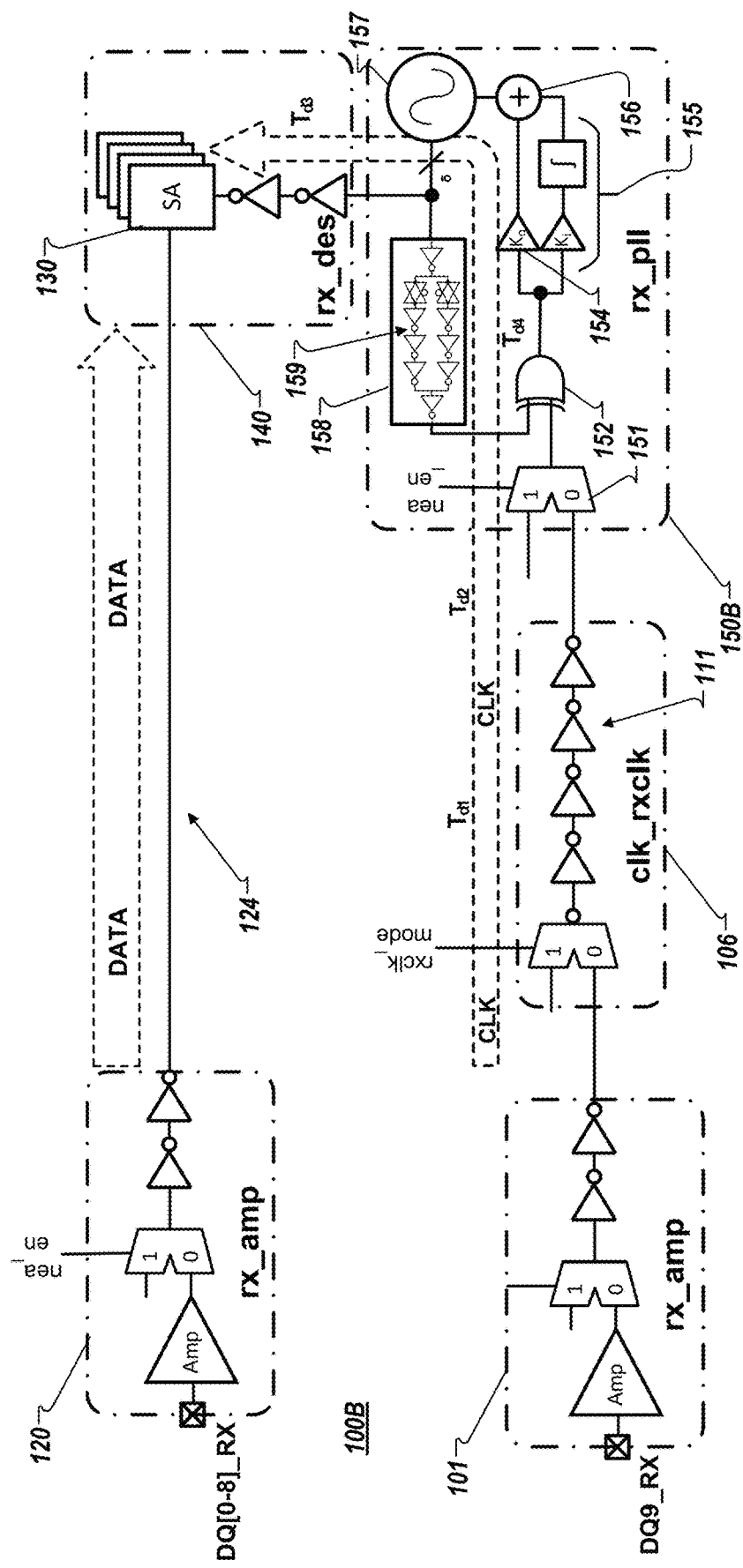
FIG. 1B is a simplified circuit diagram of the data deserializer system of the RX link device that employs a PLL circuit in accordance with at least some embodiments.

FIG. 1B is a simplified circuit diagram of the data deserializer system 100A of the RX link device that employs a PLL circuit 150B in accordance with at least some embodiments. In these embodiments, such a data deserializer system 100B includes an RX PLL 150B (e.g., in lieu of the RX DIV 150A) coupled between the RX feed-forward clock circuitry 106 and the set of sampler circuits 130. In at least some embodiments, the RX clock amplifier 101 amplifies an RX clock to generate an amplified RX clock, and the RX data amplifier 120 amplifies an RX data to generate an amplified RX data within a set of RX data lanes 124. The set of sampler circuits 130 is configured to sample the set of RX data lanes 124 according to a multiphase, corrected RX clock generated by the RX PLL 150B or according to a multiphase, corrected clock in another embodiments that is not an RX link device. The sampled data can be provided to an RX deserializer (not illustrated).

In these embodiments, the feed-forward clock circuitry 106 includes a first set of inverters 111 that have (or that can exhibit) a temperature-induced delay. In at least some embodiments, the inverter stages (or differential stages) of the first set of inverters 111 drive a heavy load and are intended to match inverter stages (or differential stages) of the set of RX data lanes 124. These inverter stages, however, are sensitive to temperature and can thus create temperature drift that generates an additional delay, which is the temperature-induced delay referred to herein.

In these embodiments, the RX PLL 150B is configured to generate the multiphase, corrected RX clock to be used for the timing of the set of sampler circuits 130. The RX PLL 150 can thus include, but not be limited to, a multiplexer 151, a phase detector 152, a proportional path circuit 154, an integral pass circuit 155, a summer 156, a ring oscillator 157, and a phase interpolator 158. In these embodiments, the processing device 160 can provide a selection signal (ne-a_en) to the multiplexer 151 to select the amplified RX clock from the RX feed-forward clock circuitry 106. The phase detector 152 can combine the amplified RX clock with an output of the phase interpolator 158 that is positioned within a feedback path from the ring oscillator 157. The phase detector 152 can be a logic gate such as an exclusive OR (XOR) gate to perform the logical combination of these clocks, although other types of logic gates are envisioned.

In at least some embodiments, an output of the phase detector 152 is fed to the proportional path circuit 154, which has an output that is fed to the summer 156, and to the integral path circuit 155, which has an output that is also fed to the summer 156, The summer 156, in turn, is coupled with the ring oscillator 157. The output of the summer 156 thus provides the current that drives the ring oscillator 157, which generates the output of the RX PLL 150, otherwise referred to herein as the multiphase, corrected RX clock that is provided to the set of sampler circuits 130.

In these embodiments, the phase interpolator 158 is positioned in a feedback path coupled between the ring oscillator 157 and the phase detector 152. The phase interpolator 158 includes a second set of inverters 159 having a negative delay that matches the temperature-induced delay of the first set of inverters 111, which causes the set of sampler circuits 130 to cancel out the common noise that exists between the feed-forward clock circuitry 106 and the set of RX data lanes 124. In these embodiments, the second set of inverters 159 include inverters that are numbered and sized identically to those of the first set of inverters 111 in order to match the delay that may be generated due to temperature drift. As mentioned, the inverters referred to herein can also be implemented as differential circuits.

Figure 2:
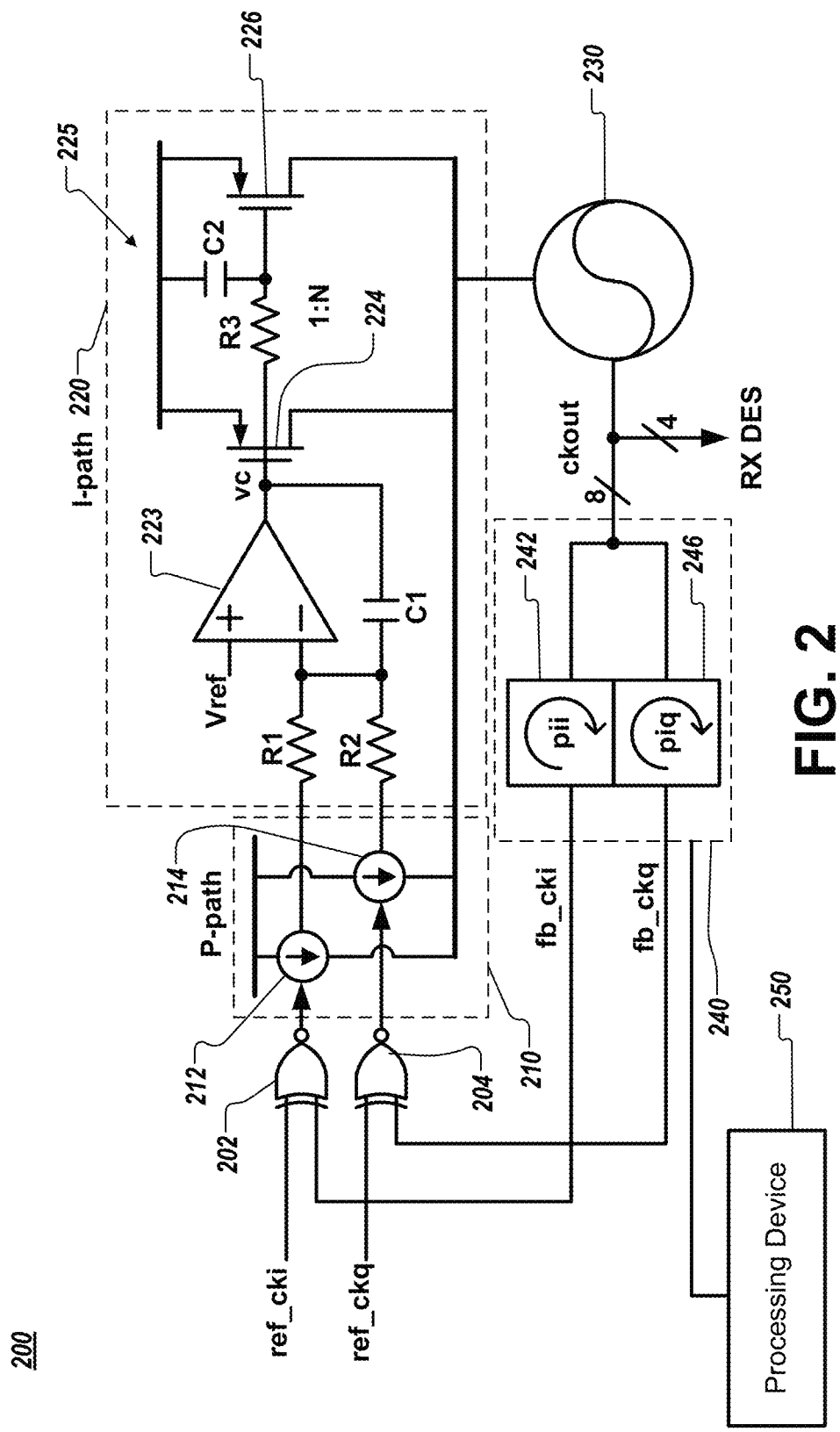
FIG. 2 is a circuit diagram of an RX phase-locked loop (PLL) coupled between the feed-forward clock circuitry and the set of sampler circuits illustrated in FIGS. 1A-1B in accordance with at least some embodiments.

FIG. 2 is a circuit diagram of an RX phase-locked loop (PLL) 200 coupled between the feed-forward clock circuitry 106 and the set of sampler circuits 130 illustrated in FIGS. 1A-1B in accordance with at least some embodiments. In some embodiments, the RX PLL 150B is replaced with the RX PLL 200. In these embodiments, the RX PLL 200 includes at least a first phase detector 202, a second phase detector 204, a proportional path component 210, an integrator circuit 220, a ring oscillator 230, a pair of phase interpolators (PIs) 240, and a processing device 250, all coupled in series, with the pair of PIs 240 positioned in a feedback path of the RX PLL 200. This feedback path terminates at inputs of the first phase detector 202 and the second phase detector 204. In at least some embodiments, the proportional path component 210 includes a first variable current source 212 coupled to an output the first phase detector 202 and a second variable current source 214 coupled to an output the second phase detector 204. Further, the integrator circuit 220 can include an operational amplifier 223, a first resistor (R1), a second resistor (R2), a first capacitor (C1), and a voltage-to-current converter 225 coupled between an output of the operational amplifier 223 and the ring oscillator 230. In some embodiments, the first resistor (R1) has the same resistance as the second resistor (R2).

In these embodiments, the RX clock provided by the feed-forward clock circuitry 106 is provided to the RX PLL 200 in two components, e.g., as an in-phase reference clock (ref_cki) and a quadrature clock (ref_ckq). In at least some embodiments, the first phase detector 202 outputs a first phase error, which is translatable to first current pulses, based on the in-phase reference clock and an in-phase feedback clock (fb_cki) output by an in-phase PI 242 of the pair of PIs 240. In these embodiments, a second phase detector outputs a second phase error, which is translatable to second current pulses, based on the quadrature reference clock, and a quadrature feedback clock (fb_ckq) received from a quadrature PI 246 of the pair of PIs 240. In at least some embodiments, the first phase detector 202 is a logic gate that logically combines the in-phase reference clock with the in-phase feedback clock, and the second phase detector 204 is a logic gate that logically combines the quadrature reference clock with the quadrature feedback clock. In some embodiments, these logic gates are both exclusive OR (XOR) gates, exclusive NOR (XNOR) gates, or the like.

In various embodiments, the proportional path component 210 is coupled to outputs of the first phase detector 202 and the second phase detector 204. The proportional path component 210 is configured to generate the first current pulses from the first phase error and the second current pulses from the second phase error. More specifically, the first variable current source 212 generates the first current pulses from the first phase error, and the second variable current source 214 generates the second current pulses from the second phase error. The variable current sources within the proportional path component 210 are responsive and fast-reacting to phase error inputs, obviating the need for heavy capacitances within the RX PLL 200, and enabling the cancelation of common noise, caused by the set of sampler circuits 200, between the clock lanes (not illustrated) and the data lanes 124 of the system 100B.

In these embodiments, the integrator circuit 220 is coupled between the proportional path component and the ring oscillator 230. In at least some embodiments, the integrator circuit sums, within a current output signal, the first current pulses and the second current pulses. The ring oscillator 230 can then be driven by the current output signal. Further, in at least some embodiments, the pair of phase interpolators (PIs) 240 are coupled to an output of the ring oscillator 230. The pair of PIs 240, e.g., the in-phase PI 242 and the quadrature PI 246, can respectively generate the in-phase feedback clock (fb_cki) and the quadrature feedback clock (fb_ckq) that are respectively received by the first phase detector 202 and the second phase detector 204.

More specifically, in these embodiments of the integrator circuit 220, the operational amplifier 223 has a positive terminal coupled to a reference voltage and has a negative terminal. The first resistor (R1) is coupled between the first variable current source 212 and the negative terminal of the operational amplifier 223. The second resistor (R2) is coupled between the second variable current source 214 and the negative terminal of the operational amplifier 223. The first capacitor (C1) is coupled between the negative terminal and an output of the operational amplifier 223. The output of the operational amplifier, at node VC, is coupled to the output of the ring oscillator 230, e.g., via the voltage-to-current converter 225. Thus, the proportional path component 210 converts the in-phase and quadrature inputs to current signals, which are in turn converted to a common voltage at the VC node. The voltage-to-current converter 225 can then convert the voltage at the VC node to the current output signal that has a single phase and drives the ring oscillator 230. In this way, the complementary current pulse from the feedback path corresponding to the in-phase PI 242 and the quadrature PI 244 can be canceled when combined at the VC node of the integrator circuit 220.

In these embodiments, the voltage-to-current converter 225 includes a pair of transistors driven by the output of the operational amplifier, e.g., a first transistor 224 having a gate coupled to the VC node, and a second transistor 226 having a gate also coupled to the VC node. The pair of transistors is coupled between a power supply and the ring oscillator 230. A third resistor (R3) coupled between gates of the pair of transistors and a second capacitor (C2) is coupled between the power supply and the third resistor (R3), e.g., at a side of the third resistor of the second resistor 226.

In some embodiments, the multiphase output signal (RX DES) that is sent to the set of sampler circuits 130 can be tapped from an output of the ring oscillator 230, which also provides the input to each PI of the pair of PIs 240. In at least some embodiments, the ring oscillator 230 has a PI phase value representing 360 degrees of phase and each of the in-phase PI 242 and the quadrature PI 246 receives a clock from the ring oscillator 230 corresponding to a range of the PI phase value, which will be discussed in more detail.

FIG. 3A is a simplified circuit diagram of a pair of phase interpolators (PIs) 300 of the PLL, e.g., of the RX PLL 200, in accordance with at least some embodiments. In these embodiments, the pair of PIs 300 includes a first PI 342 and a second PI 344. The first PI 342 includes a first multiplexer 352 (e.g., to multiplex four inputs to a single output) and a first string of inverters 362. The second PI 344 includes a second multiplexer 354 (e.g., to multiplex four inputs to a single output) and a second string of inverters 364. In this way, a first half of the multiple phases from the ring oscillator 230 go into the first PI 342, and a second half of the multiple phases go into the second PI 344. In some embodiments, the first PI 342 is the in-phase PI 242 and the second PI 344 is the quadrature PI 244 illustrated in the RX PLL 200 of FIG. 2. The pair of PIs 300 can further include a common inverter 370 that combines outputs from the first string of inverters 362 and the second string of inverter 364 to generate the PI output (PI_Out). Accordingly, in the embodiments of FIG. 2 and FIG. 5A, the first string of inverters 362 is coupled between the first multiplexer 352 and the first phase detector 202, and the second string of inverters 364 is coupled between the second multiplexer 354 and the second phase detector 204.

In at least some embodiments, the ring oscillator 230 is configured to output eight ("8") equidistant phase angles, each at 45 degrees, of 360 degrees of phase. In other embodiments, although not specifically illustrated, these phases are partitioned into 12 equidistant phase angles, each being 30 degrees, or are partitioned into six equidistant phase angles, each being 60 degrees, or another combination of phase inputs depending on implementation.

In these embodiments, the processing device 250 (e.g., control logic) can control the first multiplexer 352 to select a first phase input and control the second multiplexer 354 to select a second phase input. In these embodiments, the first phase input and the second phase input can be adjacent phase inputs of the multiphase inputs received from the signal oscillator 230. Thus, only by way of example, the first phase input can be Phase 1, and the second phase input can be Phase 0, which is illustrated. In the alternative, the first phase input can be Phase 3, and the second phase input can be Phase 4, and so forth. Further, in these embodiments, a final inverter (×16) of each string of inverters can apply a weight to each phase output of the first PI 342 and the second PI 346. In this way, the selected adjacent phases can be additionally updated to generate an arbitrary target PI output (PI_Out). In these embodiments, the first half and the second half of the multiple phases provided to the in-phase PI 242 and the quadrature PI 246, respectively, along with the weights, are selectable by control logic.

FIG. 3B is a PI code diagram illustrating that an output (PI_Out) of the pair of PIs 300 has a phase that is a combination of the phase of each PI of the pair of PIs in accordance with at least some embodiments. For example, the output (PI_Out) is the output from the common inverter 370 when each phase of each PI is directly combined. Further, as mentioned, a first weight (16-N) can be applied to the output (ph1) of the first PI 342, and a second weight (N) can be applied to the output (ph0) of the second PI 344, where N can be understood as the number of available phase inputs from the ring oscillator 230. Overall, six control bits can be employed, two bits for each multiplexer and a bit for weight control for each final inversion of each string of inverters.

FIG. 3C is a graph illustrating the PI codes associated with a voltage mode PI versus output integral nonlinearity (INL), in accordance with some embodiments. In some embodiments, these codes are numbered from 0 to 15 (e.g., 16 codes) corresponding to phase values of the input phase angles from the ring oscillator 230. As can be observed, the integral nonlinearity (INL), also referred to as linearity index, varies across these 16 codes corresponding to varying input phases. In disclosed embodiments, the additional features, discussed with reference to FIGS. 4A-4B and FIGS. 5A-5B, further increase the linearity of this phase interpolation, e.g., reduces the range of variation across the linearity index or INL discussed hereinafter.

As discussed, in at least some embodiments, the ring oscillator 230 has a PI phase value representing 360 degrees of phase, and each of the in-phase PI 242 and the quadrature PI 246 receives a clock from the ring oscillator 230 corresponding to a range of the PI phase value. For purposes of exemplary explanation, this 360 degrees of phase value can be partitioned into eight ("8") equidistant phase angles, each at 45 degrees.

Figure 4A:
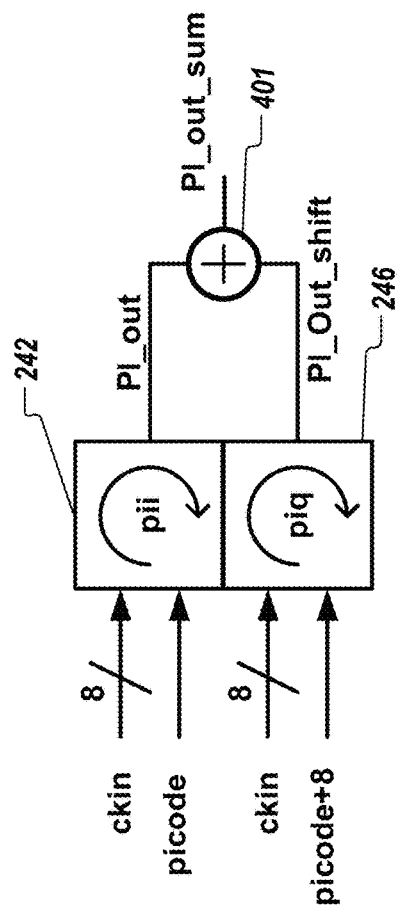
FIG. 4A is a simplified schematic diagram of input clocks and PI codes and of outputs of the pair of PIs in accordance with at least some embodiments.

In at least some embodiments, FIG. 4A is a simplified schematic diagram of input clocks and PI codes and of outputs of the pair of PIs 240 (FIG. 2). In these embodiments, the processing device 250 (e.g., control logic) is configured to input a PI code to the in-phase PI 242. This PI code corresponds to the range of the PI phase value of the clock received by the in-phase PI. An output of the in-phase PI 242 is illustrated as "PI_out."

In at least these embodiments, the control logic further shifts the PI code by a set value, e.g., eight in some embodiments, although other shift values are envisioned. In these embodiments, the control logic further inputs the shifted PI code to the quadrature PI 246. An output of the quadrature PI 246 is illustrated as "PI_out_shift." A summer 401 is employed to represent the function of the integrator circuit 220 that would combine (as in summing) the outputs of the in-phase PI 242 and the quadrature PI 246 (illustrated as "PI_out_sum"). The shift in the PI code causes an INL low point of the in-phase PI 242 to become an INL high point in the quadrature PI 246 (see FIG. 4B), causing the cancelation of these two INL once combined by the summer 401.

Figure 4B:
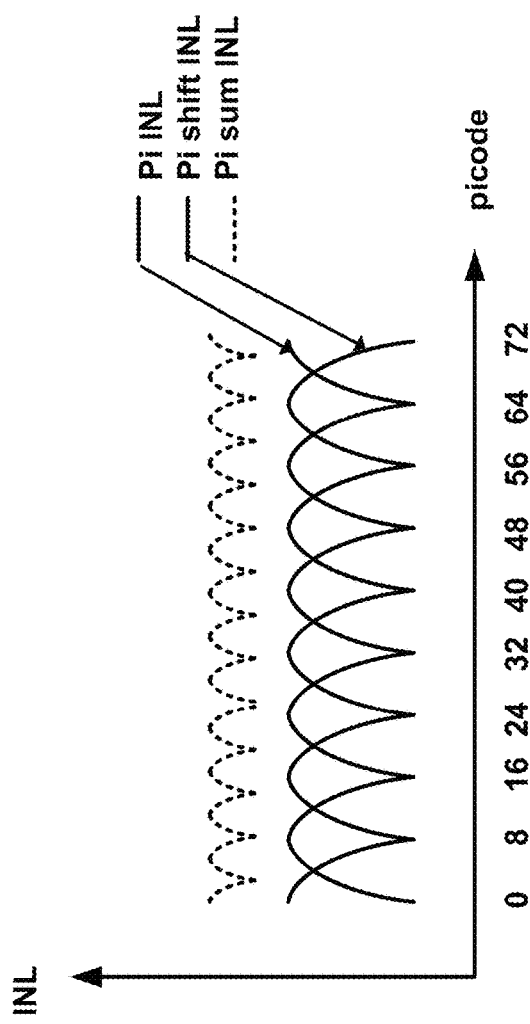
FIG. 4B is a graph illustrating PI integral nonlinearity (INL) waveforms corresponding to an in-phase PI code, a shifted quadrature PI code, and a combination of these two INL waveforms that increases linearity in accordance with at least some embodiments.

More specifically, FIG. 4B is a graph illustrating PI integral nonlinearity (INL) waveforms corresponding to an in-phase PI code, a shifted quadrature PI code, and a combination of these two PI INL waveforms that increases linearity in accordance with at least some embodiments. As illustrated, the PI INL waveform corresponding to the in-phase PI code is a sine wave that varies every 16 code values. Further, due to the shift by eight (which is a half wave of the sine wave), the PI INL waveform of the shifted quadrature PI code is a cosine wave that has an integral nonlinearity (INL) low point (e.g., at a code of 8) at an INL high point of the sine wave corresponding to the in-phase PI code. Because the PI INL difference between the high point through the in-phase PI 242 and the low point through the quadrature PI 246 is maximized, a maximum cancelation of phase offset can be achieved within the integrator circuit 220. Similarly, the same maximization of the PI INL difference is achieved where a low point in the PI INL waveform corresponding to the in-phase PI code (e.g., at a code of 16) is the high point in the PI INL waveform corresponding to the shifted quadrature PI code. As a result, the INL variation range of the PI summation INL waveform (illustrated in dashes) is significantly smaller, which is an indication of a smaller range of linearity index. In this way, the use of the shifted PI codes has increased phase interpolator linearity within the RX PLL 200.

Figures 5A, 5B:
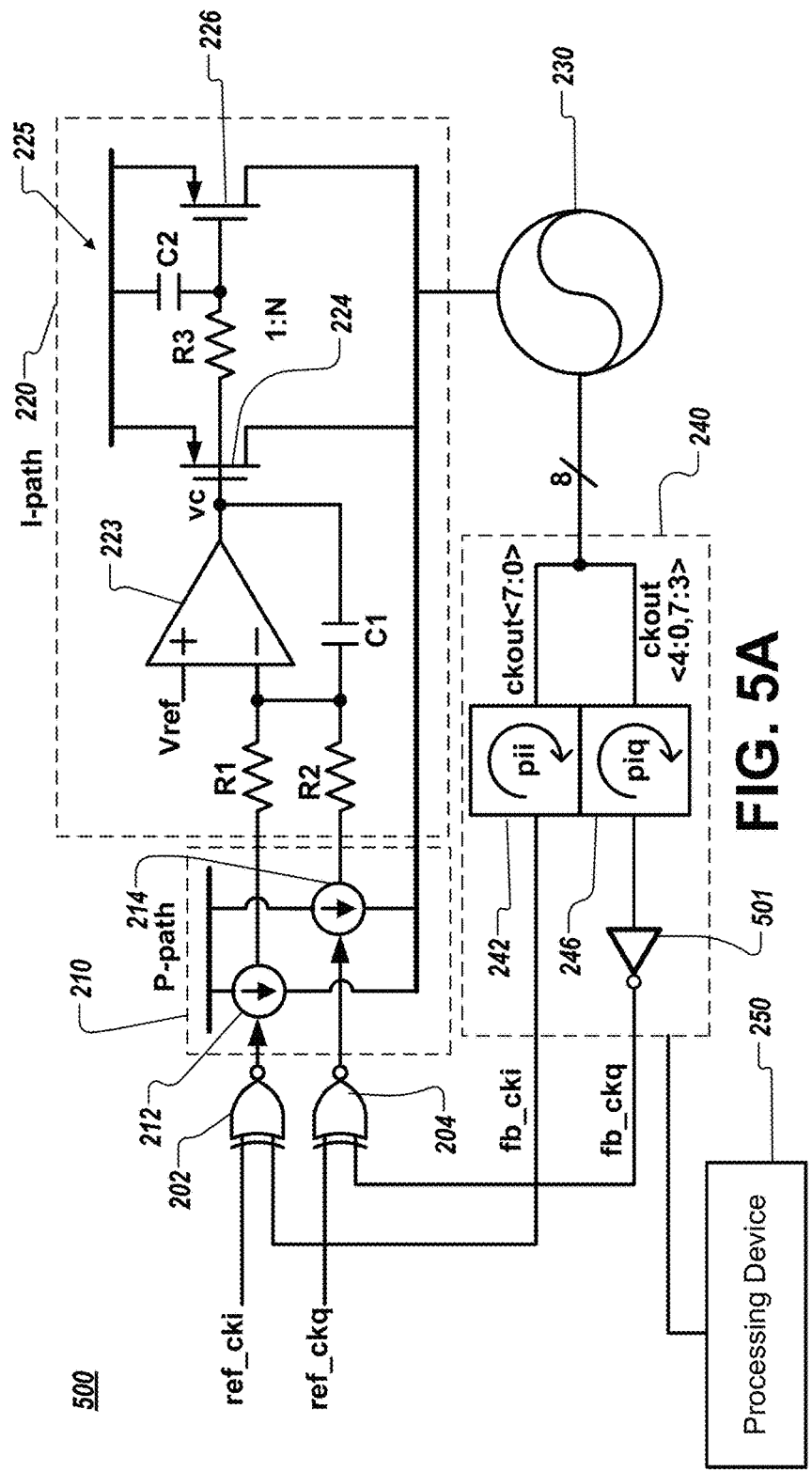
FIG. 5A is the circuit diagram of FIGS. 1A-1B with a modified set of PIs in accordance with some embodiments.
FIG. 5B is a set of diagrams illustrating various shifts between the in-phase feedback clock and the quadrature feedback clock in accordance with some embodiments.

FIG. 5A is the circuit diagram of a data deserializer system 500 in a receiving (RX) link device similar to FIGS. 1A-1B, but with a modified set of PIs in accordance with some embodiments. In some embodiments, the data deserializer system 500 is integrated with in one of the system 100B or the system 200. The system 500 of FIG. 5A further includes an inverter 501 coupled between the quadrature PI 246 and the second phase detector 204. The inverter 501 can provide a delay in the clock provided by the quadrature PI 246 compared to the in-phase PI 242, e.g., as a result of a stage inverter delay of approximately 6 picoseconds (or the like).

In at least some embodiments, the in-phase feedback clock (fb_cki) is configured to be 90 degrees out of phase with the quadrature feedback clock (fb_ckq), e.g., to facilitate maximum cancelation when combined within the integrator circuit 220. In other embodiments, the in-phase feedback clock is configured to be 270 degrees out of phase (or other determined phases) with the quadrature feedback block that facilitates maximum cancelation of phase offset within the integrator circuit 220.

FIG. 5B is a set of diagrams illustrating various shifts between the in-phase feedback clock and the quadrature feedback clock in accordance with some embodiments. As illustrated in the left-most diagram of FIG. 5B, 22.5° of the 90 degrees can be generated by the shift in the PI code discussed with reference to FIG. 4A. Further, the processing device 250 (e.g., control logic) can further shift the clock from the ring oscillator 230 by approximately 45 degrees before being input to the quadrature PI 246, e.g., at a phase tap of the quadrature PI 246. The middle diagram in FIG. 5B illustrates this phase shift of approximately 45° added to the previous 22.5° of phase shift. Finally, the inverter 501 inserted between the quadrature PI 246 and the second phase detector 204 can generate the final approximately 22.5° of phase shift between the in-phase feedback clock (fb_cki) and the quadrature feedback clock (fb_ckq). This final approximately 22.5° in phase shift is illustrated in the right-most diagram of FIG. 5B, which can be generated by a stage inverter delay of approximately 6 picoseconds provided by the inverter 501. In some embodiments, the 22.5° phase shifts may vary some and, therefore, the 45° phase shift by the control logic can be increased or decreased accordingly, e.g., between 35° to 55°.

Figure 6:
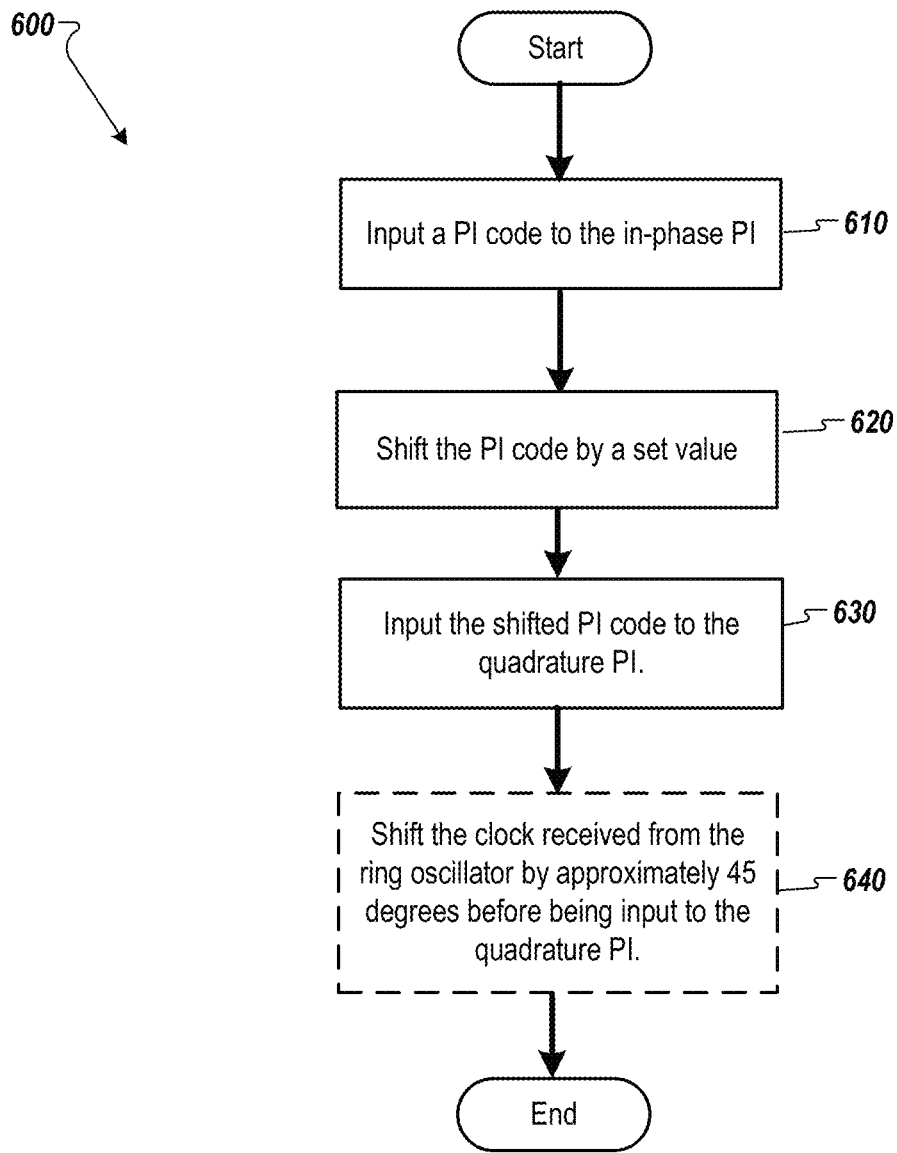
FIG. 6 is a flow diagram of an exemplary method for increasing linearity in a dual-phase interpolator of a PLL in accordance with at least some embodiments.

FIG. 6 is a flow diagram of an exemplary method 600 for increasing linearity in a dual-phase interpolator of a PLL in accordance with at least some embodiments. The method 600 can be performed by processing logic comprising hardware, software, firmware, or any combination thereof. In at least one embodiment, the method 600 is performed by the processing device 250 of FIG. 2 and FIG. 5A, and with reference to the systems 100B, 200, and 500, as were discussed.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic inputs a PI code to the in-phase PI 242. This PI code corresponds to the range of the PI phase value of the clock received by the in-phase PI.

At operation 620, the processing logic shifts the PI code by a set value, e.g., a certain phase angle.

At operation 630, the processing logic inputs the shifted PI code to the quadrature PI 244. The shift in the PI code causes an integral nonlinearity (INL) low point of the in-phase PI 242 to become an INL high point in the quadrature PI 244.

At operation 640, the processing logic optionally also shifts the clock received from the ring oscillator 230 by approximately 45 degrees before being input to the quadrature PI.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A phase-locked loop (PLL) device comprising:
   a first phase detector to receive an in-phase reference clock and an in-phase feedback clock, the first phase detector to output a first phase error;
   a second phase detector to receive a quadrature reference clock and a quadrature feedback clock, the second phase detector to output a second phase error;

a first variable current source to convert the first phase error to first current pulses;

a second variable current source to convert the second phase error to second current pulses;

an integrator circuit coupled to the first variable current source and the second variable current source, the integrator circuit to sum, within a current output signal, the first current pulses and the second current pulses;

a ring oscillator to be driven by the current output signal; and a pair of phase interpolators coupled to an output of the ring oscillator, the pair of phase interpolators to respectively generate the in-phase feedback clock and the quadrature feedback clock.

2. The PLL device of claim 1, wherein the pair of phase interpolators (PIs) comprises:

an in-phase PI to generate the in-phase feedback clock; and a quadrature PI to generate the quadrature feedback clock; and wherein the ring oscillator has a PI phase value representing 360 degrees of phase and each of the in-phase PI and the quadrature PI receives a clock from the ring oscillator corresponding to a range of the PI phase value.

3. The PLL device of claim 2, wherein the in-phase PI comprises:

a multiplexer to select a first phase input from a first half of multiple phases generated by the ring oscillator; and a string of inverters coupled between the multiplexer and the first phase detector, wherein a final inverter of the string of inverters is to apply a first weight to a first phase output of the string of inverters, wherein the first half of the multiple phases and the first weight are selectable by control logic.

4. The PLL device of claim 2, wherein the quadrature PI comprises:

a multiplexer to select a second phase input from a second half of multiple phases generated by the ring oscillator; and a string of inverters coupled between the multiplexer and the second phase detector, wherein a final inverter of the string of inverters is to apply a second weight to a second phase output of the string of inverters, wherein the second half of the multiple phases and the second weight are selectable by control logic.

5. The PLL device of claim 2, further comprising control logic coupled to the in-phase PI and the quadrature PI, the control logic to:

input a PI code to the in-phase PI, wherein the PI code corresponds to the range of the PI phase value of the clock received by the in-phase PI;

shift the PI code by a set value; and input the shifted PI code to the quadrature PI, wherein the shift in the PI code causes an integral nonlinearity (INL) low point of the in-phase PI to become an INL high point in the quadrature PI.

6. The PLL device of claim 2, further comprising:

control logic coupled to the in-phase PI and the quadrature PI, the control logic to shift the clock received from the ring oscillator by between 35 to 55 degrees before being input to the quadrature PI; and an inverter coupled between the quadrature PI and the second phase detector, the inverter providing a delay in the clock provided by the quadrature PI compared to the in-phase PI.

7. The PLL device of claim 1, wherein the integrator circuit comprises:

an operational amplifier having a positive terminal coupled to a reference voltage and having a negative terminal;

a first resistor coupled between the first variable current source and the negative terminal;

a second resistor coupled between the second variable current source and the negative terminal;

a capacitor coupled between the negative terminal and an output of the operational amplifier; and a pair of transistors driven by the output of the operational amplifier, wherein the pair of transistors are coupled between a power supply and the ring oscillator.

8. A phase-locked loop (PLL) circuit comprising:

a first phase detector to receive an in-phase reference clock and an in-phase feedback clock;

a second phase detector to receive a quadrature reference clock and a quadrature feedback clock;

a first variable current source to convert a first phase error received from the first phase detector into first current pulses;

a second variable current source to convert a second phase error received from the second phase detector into second current pulses;

an integrator circuit to sum, within a current output signal, the first current pulses and the second current pulses;

a ring oscillator to be driven by the current output signal;

an in-phase phase interpolator (PI) coupled to an output of the ring oscillator, the in-phase PI to generate the in-phase feedback clock; and a quadrature PI coupled to the output of the ring oscillator, the quadrature PI to generate the quadrature feedback clock.

9. The PLL circuit of claim 8, wherein the ring oscillator has a PI phase value representing 360 degrees of phase and each of the in-phase PI and the quadrature PI receives a clock from the ring oscillator comprising a range of the PI phase value.

10. The PLL circuit of claim 9, wherein the in-phase PI comprises:

a multiplexer to select a first phase input from a first half of multiple phases generated by the ring oscillator; and a string of inverters coupled between the multiplexer and the first phase detector, wherein a final inverter of the string of inverters is to apply a first weight to a first phase output of the string of inverters, wherein the first half of the multiple phases and the first weight are selectable by control logic.

11. The PLL circuit of claim 9, wherein the quadrature PI comprises:

a multiplexer to select a second phase input from a second half of multiple phases generated by the ring oscillator; and a string of inverters coupled between the multiplexer and the second phase detector, wherein a final inverter of the string of inverters is to apply a second weight to a second phase output of the string of inverters, wherein the second half of the multiple phases and the second weight are selectable by control logic.

12. The PLL circuit of claim 9, further comprising control logic coupled to the in-phase PI and the quadrature PI, the control logic to:

input a PI code to the in-phase PI, wherein the PI code corresponds to the range of the PI phase value of the clock received by the in-phase PI;

shift the PI code by a set value; and input the shifted PI code to the quadrature PI, wherein the shift in the PI code causes an integral nonlinearity (INL) low point of the in-phase PI to become an INL high point in the quadrature PI.

13. The PLL circuit of claim 9, further comprising:
control logic coupled to the in-phase PI and the quadrature PI, the control logic to shift the clock received from the ring oscillator by between 35 to 55 degrees before being input to the quadrature PI; and
an inverter coupled between the quadrature PI and the second phase detector, the inverter providing a delay in the clock provided by the quadrature PI compared to the in-phase PI.

14. The PLL circuit of claim 8, wherein the integrator circuit comprises:
an operational amplifier having a positive terminal coupled to a reference voltage and having a negative terminal;
a first resistor coupled between the first variable current source and the negative terminal;
a second resistor coupled between the second variable current source and the negative terminal;
a capacitor coupled between the negative terminal and an output of the operational amplifier; and
a pair of transistors driven by the output of the operational amplifier, wherein the pair of transistors are coupled between a power supply and the ring oscillator.

15. A system comprising:
feed-forward clock circuitry to provide a receiver (RX) clock to a sampler circuit that is to sample a data lane of a set of RX data lanes, the RX clock comprising an in-phase reference clock and a quadrature reference clock; and
an RX phase-locked loop coupled between the feed-forward clock circuitry and the sampler circuit, the RX PLL comprising:
a first phase detector to receive the in-phase reference clock and an in-phase feedback clock, the first phase detector to output a first phase error;
a second phase detector to receive the quadrature reference clock and a quadrature feedback clock, the second phase detector to output a second phase error;
a first variable current source to convert the first phase error to first current pulses;
a second variable current source to convert the second phase error to second current pulses;
an integrator circuit coupled to the first variable current source and the second variable current source, the integrator circuit to sum, within a current output signal, the first current pulses and the second current pulses;
a ring oscillator to be driven by the current output signal; and
a pair of phase interpolators coupled to an output of the ring oscillator, the pair of phase interpolators to respectively generate the in-phase feedback clock and the quadrature feedback clock.

16. The system of claim 15, wherein the pair of phase interpolators (PIs) comprises:
an in-phase PI to generate the in-phase feedback clock; and
a quadrature PI to generate the quadrature feedback clock; and
wherein the ring oscillator has a PI phase value representing 360 degrees of phase and each of the in-phase PI and the quadrature PI receives a clock from the ring oscillator comprising a range of the PI phase value.

17. The system of claim 16, further comprising an inverter coupled between the quadrature PI and the second phase detector, the inverter providing a delay in the clock provided by the quadrature PI compared to the in-phase PI.

18. The system of claim 17, further comprising control logic coupled to the in-phase PI and the quadrature PI, the control logic to:
input a PI code to the in-phase PI, wherein the PI code corresponds to the range of the PI phase value of the clock received by the in-phase PI;
shift the PI code by a set value;
input the shifted PI code to the quadrature PI, wherein the shift in the PI code causes an integral nonlinearity (INL) low point of the in-phase PI to become an INL high point in the quadrature PI; and
shift the clock received from the ring oscillator by between 35 and 55 degrees before being input to the quadrature PI.

\* \* \* \* \*